United States Patent
Ponoth et al.

(10) Patent No.: US 9,698,148 B2
(45) Date of Patent: Jul. 4, 2017

(54) REDUCED FOOTPRINT LDMOS STRUCTURE FOR FINFET TECHNOLOGIES

(71) Applicant: Avago Technologies General IP (Singapore) Pte. Ltd., Singapore (SG)

(72) Inventors: Shom Ponoth, Irvine, CA (US); Akira Ito, Irvine, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 14/954,700

(22) Filed: Nov. 30, 2015

(65) Prior Publication Data

US 2017/0018551 A1 Jan. 19, 2017

Related U.S. Application Data

(60) Provisional application No. 62/193,967, filed on Jul. 17, 2015.

(51) Int. Cl.
*H01L 27/092* (2006.01)
*H01L 29/78* (2006.01)
*H01L 29/06* (2006.01)

(52) U.S. Cl.
CPC ...... *H01L 27/0924* (2013.01); *H01L 29/0653* (2013.01); *H01L 29/7816* (2013.01); *H01L 29/7835* (2013.01)

(58) Field of Classification Search
CPC .................................................. H01L 27/0924
USPC ......................................................... 257/338
See application file for complete search history.

(56) References Cited

U.S. PATENT DOCUMENTS

| | | | |
|---|---|---|---|
| 2014/0008733 A1* | 1/2014 | Shrivastava | H01L 21/823807 257/401 |
| 2014/0191315 A1* | 7/2014 | Ito | H01L 29/66484 257/336 |
| 2014/0339649 A1* | 11/2014 | Campi, Jr. | H01L 29/7816 257/409 |
| 2015/0035053 A1* | 2/2015 | Singh | H01L 27/0886 257/337 |
| 2016/0093730 A1* | 3/2016 | Li | H01L 29/66545 257/335 |
| 2016/0141365 A1* | 5/2016 | Campi, Jr. | H01L 29/66712 257/329 |
| 2016/0225895 A1* | 8/2016 | He | H01L 29/7816 |

* cited by examiner

*Primary Examiner* — Moazzam Hossain
(74) *Attorney, Agent, or Firm* — Sterne, Kessler, Goldstein & Fox P.L.L.C.

(57) ABSTRACT

A field effect transistor (FET) having one or more fins provides an extended current path as compared to conventional finFETs. A source terminal is disposed on a first fin between a first dummy gate and a gate structure. A drain terminal is disposed on a second fin between a second dummy gate and a third dummy gate. A first gate oxide layer disposed under second and third dummy gates is made to be thinner than a second gate oxide layer disposed under the first dummy gate and the gate structure. By making the first gate oxide layer thinner, an overall footprint of the finFET device is reduced.

20 Claims, 6 Drawing Sheets

REDUCED FOOTPRINT LDMOS STRUCTURE FOR FINFET TECHNOLOGIES

CROSS REFERENCE TO RELATED APPLICATIONS

The present application claims the benefit of U.S. Provisional Patent Application No. 62/193,967, filed on Jul. 17, 2015, which is hereby incorporated by reference in its entirety.

FIELD

Embodiments of the present disclosure relate generally to the physical structure of the field effect transistor (FET), including implementing an extended drain device using a finFET architecture.

BACKGROUND

Advances in semiconductor manufacturing technologies have resulted in dramatically increased circuit packing densities and higher speeds of operation. In order to achieve such increased densities, a wide variety of evolutionary changes have taken place with respect to semiconductor processing techniques and semiconductor device structures over the years.

Many of these process and structural changes have been introduced in connection with device scaling, in which ever smaller device geometries have been achieved. One consequence of conventional FET device scaling is a requirement to reduce operating voltages. The reduced operating voltages are required, at least in part, because conventional FET device scaling needs a thinner gate dielectric layer in order to produce the desired electrical characteristics in the scaled-down transistor. Without a reduction in operating voltage, the electric field impressed across the thinner gate dielectric during circuit operation can be high enough for dielectric breakdown to become a problem.

A common goal of all integrated circuit designs is to reduce the footprint (e.g., the amount of space) that the circuit occupies. Integrated circuits with reduced footprints can help to make the overall size of an electronic device smaller, or can allow for more integrated circuits to be contained within a device while maintaining the size of the device. However, the goal of reducing the footprint of a particular device can stand in tension with other design goals and needs pertinent to semiconductor devices.

BRIEF DESCRIPTION OF THE DRAWINGS

Various exemplary embodiments are described with reference to the accompanying drawings. In the drawings, like reference numbers indicate identical or functionally similar elements. Additionally, the left most digit(s) of a reference number identifies the drawing in which the reference number first appears.

Figure 1:
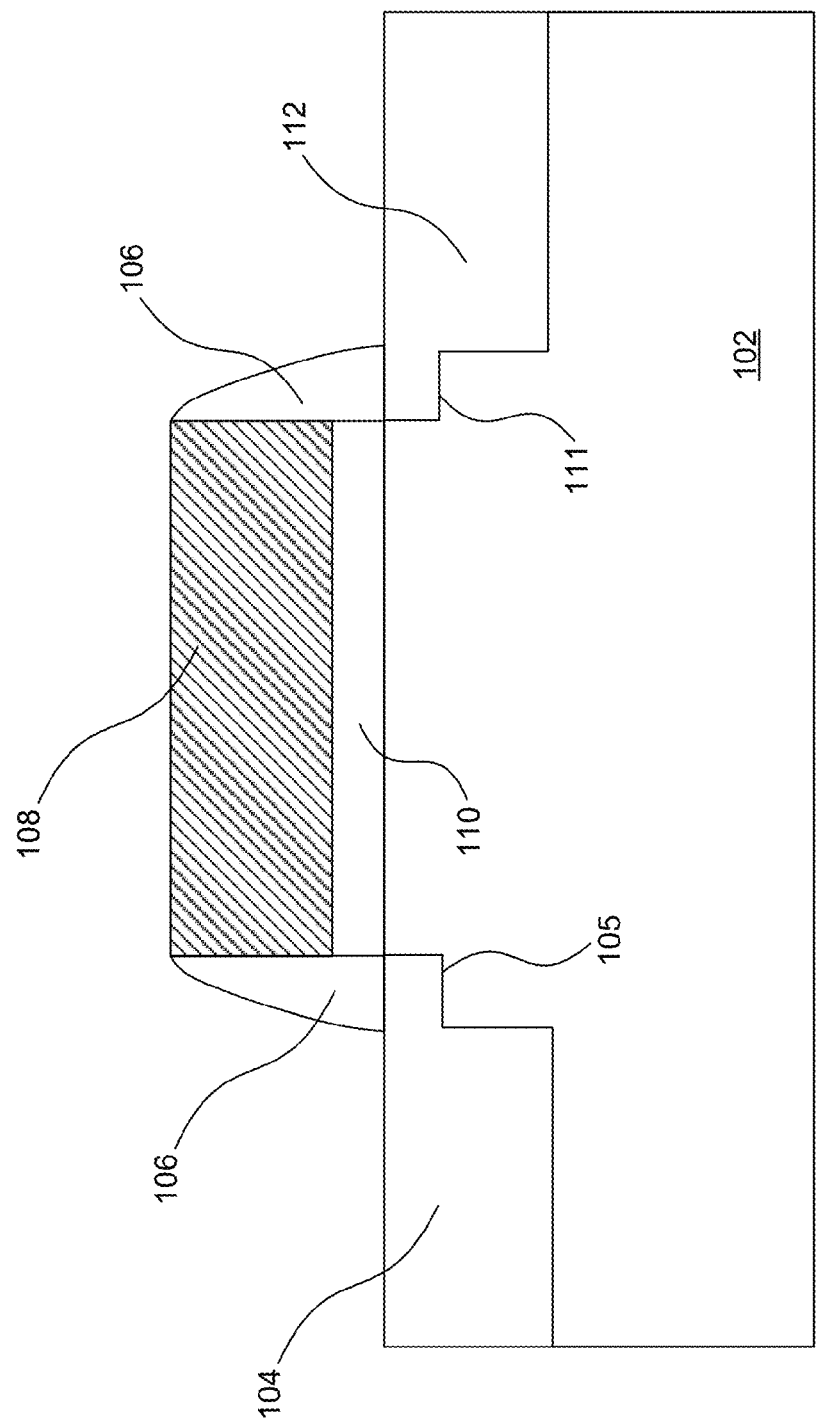
FIG. 1 is a cross-sectional representation of a conventional planar FET according to examples of the disclosure.

It is noted that the drawn representations of various semiconductor structures shown in the figures are not necessarily drawn to scale, but rather, as is the practice in this field, drawn to promote a clear understanding of the structures and process steps which they are illustrating.

DETAILED DESCRIPTION

The following Detailed Description refers to accompanying drawings to illustrate exemplary embodiments. References in the Detailed Description to "one exemplary embodiment," "an illustrative embodiment", "an exemplary embodiment," and so on, indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications may be made to the exemplary embodiments within the spirit and scope of the disclosure.

It is to be understood that the phraseology or terminology herein is for the purpose of description and not of limitation, such that the terminology or phraseology of the present specification is to be interpreted by those skilled in relevant art(s) in light of the teachings herein.

Terminology

The terms, chip, die, integrated circuit (IC), semiconductor device, and microelectronic device, are often used interchangeably in the field of electronics.

With respect to chips, it is common that power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips are commonly made by way of electrical conductors, those skilled in the art will appreciate that chips and other circuit elements may alternatively be coupled by way of, but not limited to, optical, mechanical, magnetic, electrostatic, and electromagnetic interfaces.

The terms metal line, trace, wire, interconnect, conductor, signal path and signaling medium can all be related. The related terms listed above, are generally interchangeable, and appear in order from specific to general. In this field, metal lines are sometimes referred to as traces, wires, lines, interconnect or simply metal. Metal lines, such as, but not limited to, aluminum (Al), copper (Cu), an alloy of Al and Cu, an alloy of Al, Cu and silicon (Si), tungsten (W), nickel (Ni), titanium nitride (TiN), and tantalum nitride (TaN) are conductors that provide signal paths for interconnecting electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), cobalt (Co), molybdenum (Mo), and refractory metal silicides are examples of other conductors.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as "poly." It is noted that polysilicon be used to form the gate electrode of a FET. An alternative use of polysilicon is as a sacrificial gate electrode that is removed and replaced with a metal gate during the manufacturing process.

Epitaxial layer refers to a layer of single crystal semiconductor material. In this field, an epitaxial layer can be referred to "epi."

FET, as used herein, refers to a metal-oxide-semiconductor field effect transistor (MOSFET). An n-channel FET is referred to herein as an NFET. A p-channel FET is referred to herein as a PFET. FETs generally have four terminals, namely gate, drain, source and body.

Effective oxide thickness refers to the thickness of a layer of $SiO_2$ that is electrically equivalent to a given thickness of a material having a given dielectric constant. In some circumstances, it is the electrical characteristic of a dielectric layer (which is proportional to layer thickness/dielectric constant) that is of interest rather than the actual physical thickness of the layer. Historically, the gate dielectric layer was formed almost exclusively from silicon dioxide, but that is no longer the case in the semiconductor industry. Since there are a variety of materials now in use as gate dielectrics, it is easier for the sake of comparison to discuss these gate dielectrics in terms of a normalized value such as effective oxide thickness. By way of example, since $HfO_2$ has a dielectric constant of 25 (compared to 3.9 for $SiO_2$), a 6.4 nm layer of $HfO_2$ has an effective oxide thickness of 1 nm. In other words, a layer of high dielectric constant material can be electrically equivalent to a thinner layer of lower dielectric constant material.

As used herein, "gate" refers to the insulated gate terminal of a FET that includes a gate electrode disposed on top of the gate dielectric. The gate can control the conductivity of the FET based on a voltage applied to the gate electrode.

Source/drain (S/D) terminals refer to the terminals of a PET, between which conduction occurs under the influence of an electric field, resulting from a voltage applied to the gate electrode of the FET. In embodiments, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Substrate, as used herein, refers to the physical object that is the basic workpiece transformed by various process operations into the desired microelectronic configuration. A typical substrate used for the manufacture of integrated circuits is a wafer. Wafers, may be made of semiconducting (e.g., bulk silicon), non-semiconducting (e.g., glass), or combinations of semiconducting and non-semiconducting materials (e.g., silicon-on-insulator (SOD). In the semiconductor industry, a bulk silicon wafer is a very commonly used substrate for the manufacture of integrated circuits.

Exemplary Structures

FIG. 1 is a cross-sectional representation of a conventional planar FET. A gate dielectric layer 110 is disposed on the surface of a substrate 102. A gate electrode 108 is disposed on gate dielectric layer 110. Sidewall spacers 106 are disposed adjacent gate electrode 108 and gate dielectric layer 110. A first source/drain terminal 104, and a second source/drain terminal 112 are formed in substrate 102. First source/drain terminal 104 has a first source/drain extension 105, and second source/drain terminal 112 has a second source/drain extension 111. First and second source/drain terminals 104, 112 are symmetric with respect to gate 108.

Historically, FETs have been fabricated as planar devices as illustrated in FIG. 1. However, a vertically oriented device, referred to as a "finFET," has more recently been introduced into commercial semiconductor products. As further discussed below, a finFET includes a wrap-around gate structure which can provide better electrical control over the channel, thus reducing leakage current and overcoming other short-channel effects.

Figure 2:
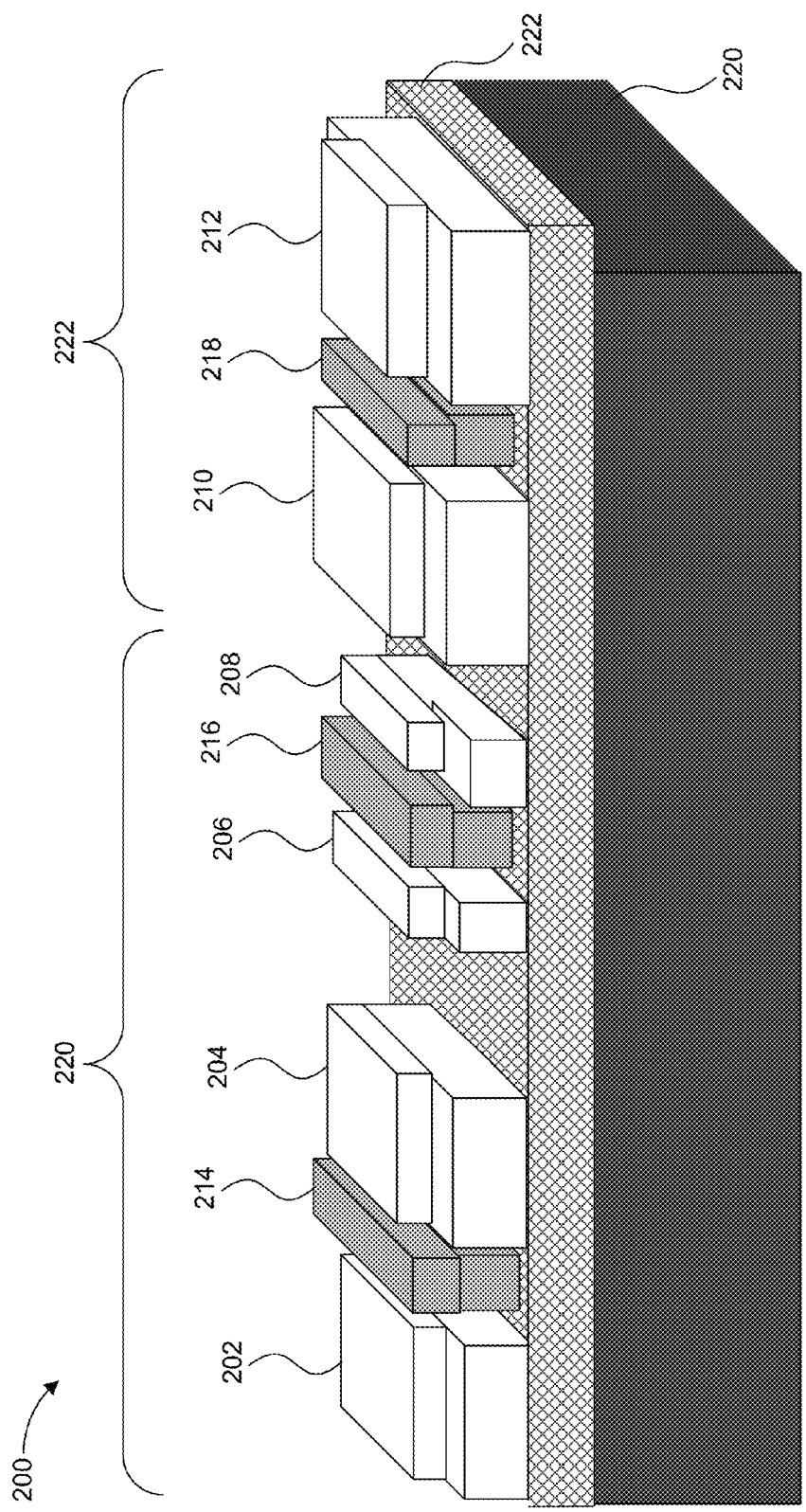
FIG. 2 is a 3D illustration of a finFET device having an extended current path between the source and drain terminals according to examples of the disclosure.

FIG. 2 illustrates a 3D illustration of a finFET device having an extended current path between the source and drain terminals according to examples of the disclosure. The device 200 includes a source region 214. The source region 214 is disposed between a dummy gate 202, and a gate structure 204. The source region 214 is disposed within a fin structure (not pictured). The fin structure is wrapped and surrounded by dummy gate 202 and gate structure 204. A full description of the source region 214, the dummy gate 202, the gate structure 204, and the fin are provided below with respect to the discussion of their counterparts illustrated in FIGS. 4a and 4b.

The device illustrated in FIG. 2 also includes drain region 216. The drain region 216 is disposed between a two dummy gates 206 and 208. The source region 214, gate structure 204, drain region 216, and the dummy gates 202, 206, and 208 form a first FINFET 220. The drain region 216 is further disposed within a fin structure (not pictured). The fin structure within which the drain region 216 is disposed is separate from that of the fin structure within which the source region 214 is disposed. The fin structure that contains the drain region 216 is wrapped around and surrounded by dummy gates 206 and 208. A full description of the drain region 216, dummy gates 206 and 208, and the fin structure are provided below with respect to the discussion of their counterparts illustrated in FIGS. 4a and 4b.

The device illustrated in FIG. 2 can be stepped and repeated along the same device as illustrated by source region 218, dummy gate 210, and gate structure 212 which represent one half of a separate finFET 222.

All of the components described above with respect to FIG. 2 can be disposed above a first substrate layer 222 and a second substrate layer 220 which will be described further below with respect to their counterparts illustrated in FIGS. 4a and 4b.

Figure 3:
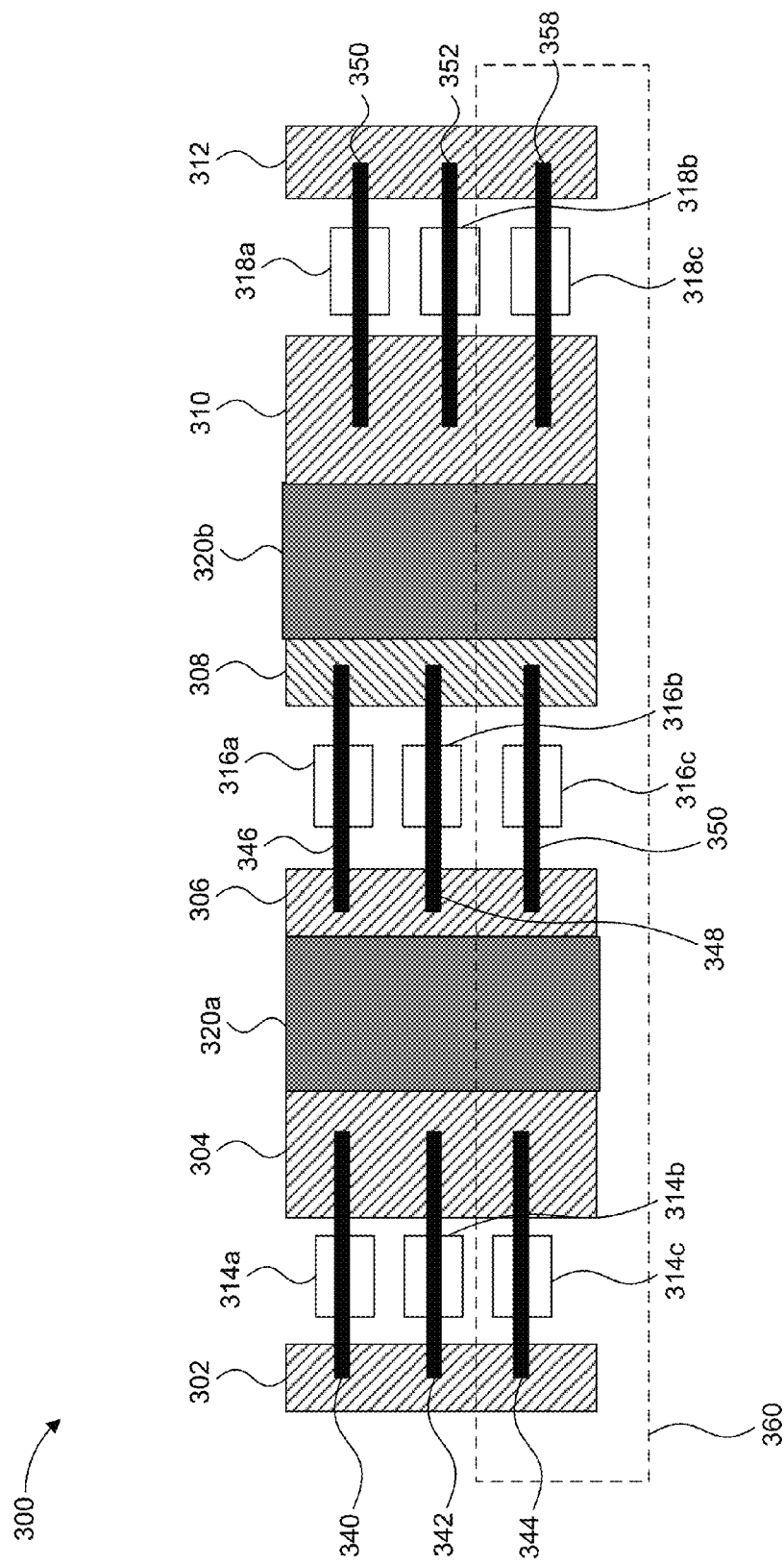
FIG. 3 is a 2D illustration of a finFET device having an extended current path between the source and drain terminals according to examples of the disclosure.

FIG. 3 illustrates a 2D representation of a finFET device having an extended current path between the source and drain terminals according to examples of the disclosure. The device illustrated in FIG. 3 is a top view of a three fin device stepped and repeated. In other words, the device of FIG. 3 as illustrated, contains 3 separate channels, each channel with its own source and drain. The device 300 includes fins 340, 342, and 344. Each fin has a source region 314a, 314b, and 314c embedded with the fin (described in further detail below). The fins 340, 342, and 344 are disposed between dummy gate 302 and gate structure 304. Source regions 314a, b, and c form channels with drain regions 316a, b, and c respectively. Drain regions 316a, b, and c are disposed within fins 346, 348, and 350 respectively. Fins 346, 348, and 350 are disposed between and within dummy gates 306 and 308. In the top view of FIG. 3 a shallow trench isolation region 320a is disposed between and underneath gate 304 and dummy gate 306. The placement of the shallow trench isolation region 320 is explained further below with respect to FIGS. 4a and 4b.

The device is also stepped and repeated as in the example of FIG. 2. Therefore, a second shallow trench isolation region 320b is disposed underneath and between gate 310 and dummy gate 312. Fins 350, 352, and 358 are embedded within dummy gate 310 and gate structure 312. Like the example before, each fin (350, 352, and 358) has a source region 318a, b, c, embedded within it.

The dashed region 360 of FIG. 3 is discussed in detail below with respect to FIGS. 4a and 4b.

Figure 4A:
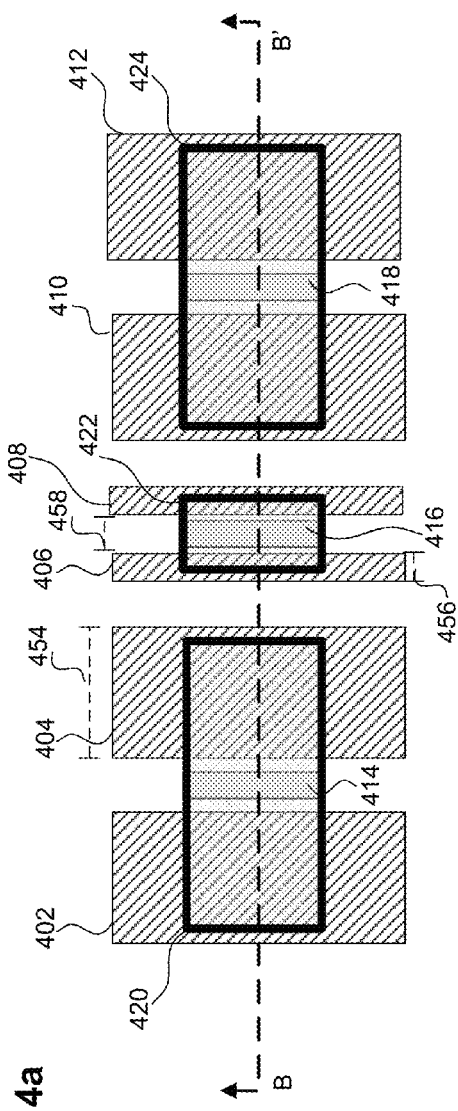
FIG. 4a is a top view of a first exemplary embodiment of a finFET having an extended current path between source and drain terminals according to examples of the disclosure.

FIG. 4a is a top view of a first exemplary embodiment of a finFET having an extended current path between the source and drain terminals according to examples of the disclosure. This top view shows a finFET constructed over two separate, co-linear fins 420 and 422 This embodiment illustrated in FIG. 4a can be stepped and repeated along the same device as illustrated by fin 424 embedded with dummy gate 410 and gate structure 412 which represents one half of a separate finFET.

A first source region 414 can be disposed between gate 404 and fin termination structure 402. The first source region 414 can be implemented in a raised source/drain architecture, meaning that it is formed above the channel in whole or in part. The first source region 414 can be either p or n doped depending on the type of semiconductor device being implemented. The source region 414 can be doped using in-situ doping techniques or can be implant doped. In the case of a pnp device, the source 414 can be p+ doped and in the case of an npn device the source can be n+ doped. The raised source region 414 is created by growing an epitaxial film. In some embodiments of the disclosure, the epitaxy used to grow the raised source/drain regions is a "selective" epitaxy that only grows on silicon based regions of the device that the epitaxial film is exposed to.

As discussed above, the first source region 414 is disposed between gate structure 404 and fin termination structure 402. Gate structures for finFETs in accordance with this disclosure include a gate dielectric layer and a gate electrode. The illustrated gate structures may remain in place as the final gate structures of the finFETs, or they may be removed and replaced with alternative gate dielectric and/or gate electrode materials. Gate replacement processes, for example high-k, metal gate (HKMG) are well-known in the semiconductor manufacturing field and are not further described herein.

For the purpose of process efficiency, fin termination structure 402 can be made up of the same structure and materials as gate 404, however the fin termination structure will be electrically isolated (i.e., not connected to an electric signal). Due to this fact, fin termination structure 402 can also be called a "dummy gate." Throughout this disclosure the term dummy gate will be used interchangeably to describe the fin termination structure. Accordingly, a dummy gate has the same structure as a "real" gate (e.g. gate structure 404), but receives no control signal and therefore does not control the conductivity of any channel for carriers. By disposing the first source region 414 between gate structure 404 and dummy gate 402, an epitaxial growth of the first source region 414 is contained. As discussed above, the raised source region can be created using a selective epitaxy that grows only on silicon based regions of the device that are exposed to the epitaxial film. Thus, in order to contain epitaxial growth and isolate the raised source region to desired areas of the device, the exposure to silicon based regions when an epitaxy is deposited should be controlled. By depositing source region 414 between dummy gate 402 and gate structure 404 such control is achieved.

Drain region 416 can be disposed between dummy gate 406 and 408. Drain region 416 can be implemented in a raised source/drain architecture as described with respect to first source region 414 and can also implemented using in-situ or implant doped epitaxy as also described with respect to source region 414. Similar to dummy gate 402, dummy gates 406 and 408 can be implemented as electrically isolated gate structures used to contain the epitaxial growth of raised drain region 416. Dummy gates 406 and 408, raised drain region 416 within fin 422 can be disposed above a shallow trench isolation region 426 as illustrated and further discussed in FIG. 4b below.

Dummy gates 410, gate structure 412, source region 418 and fin 424 are arranged in an identical manner as their counterparts 402, 404, 414, and 420 respectively. Just as dummy gate 402 and gate 404 can be used to contain the epitaxial growth of source region 414, dummy gates 410 and gate structure 412 can be utilized to contain the epitaxial growth of source region 418.

Figure 4B:
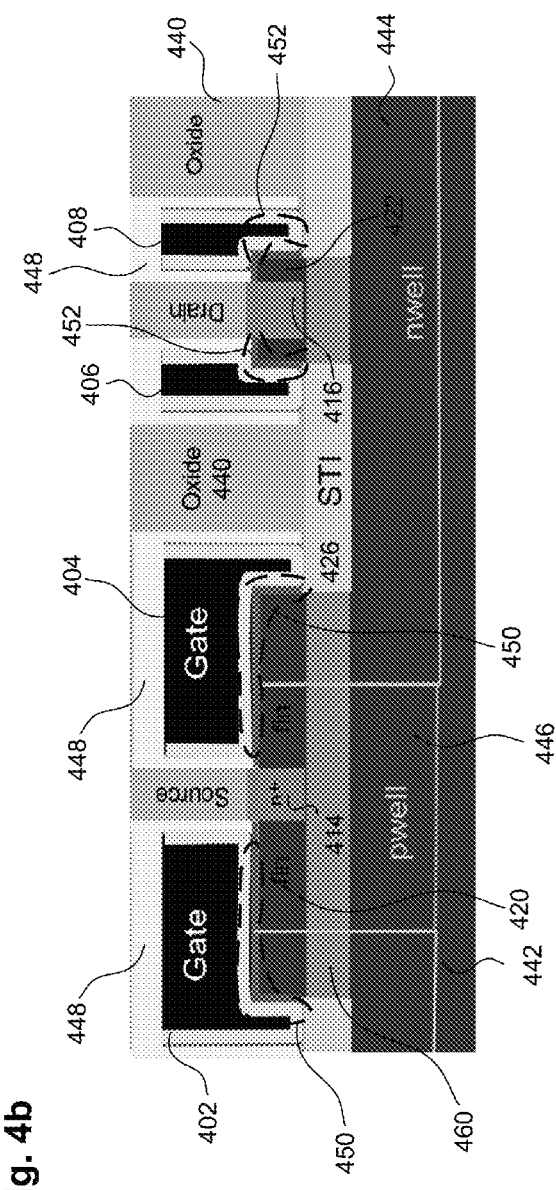
FIG. 4b is a cross-sectional view of the structure of FIG. 4a according to examples of the disclosure.

FIG. 4b is a cross-sectional view of the structure of FIG. 4a taken through line B-B' that is shown in FIG. 4a. As illustrated, source region 414 is deposited within fin structure 420. Dummy gate 402 and gate 404 are deposited above and wrapped around the side edges of fin 420. While source region 414 is deposited within fin 420, the top portion of the drain region is exposed. In order to constrain any undesired epitaxial growth, and as discussed above, gate structure 404 and dummy gate 402 can act as barriers between the source 414 and any exposed silicon layers. A spacer layer 448 can be deposited such that it surrounds dummy gate 402 and gate 404 to provide any required spacing. Additionally, middle of the line oxide (MEOL) oxide layer 440 can be deposited above any exposed structures in which metallic wiring to source, drain and gate will be fabricated. It is noted that fin 424 and its associated components 410, 412, and 418 are not shown in FIG. 4b for convenience.

As noted above, the device in FIGS. 4a and 4b contains an extended current path between the source and drain terminals. The extended current path between the source and drain terminals can be described as an extended drain topology. Extended drain devices are created by disposing a gate structure of a device such that the gate of the device is disposed closer to the source relative to the drain. By disposing the gate in this manner, the resistance between the source and drain is increased thereby leading to device with a higher breakdown voltage. As illustrated in FIGS. 4a and 4b, gate structure 404 is disposed adjacent to source region 414, while drain region 416 is separated from the gate structure 404 by shallow trench isolation region 416. Accordingly, the lateral distance between the gate and drain is longer than the lateral distance between the gate and source. In this manner, an extended drain can be created. In the case of an NPN device, a P-well 446 is disposed above silicon layer 442 and beneath source region 414 as illustrated. To create the extended drain region, a lightly doped (relative to the doping concentration of drain 416) N-well 444 is deposited above silicon layer 442 and below gate structure 404, shallow trench isolation 426, and drain region 416 as illustrated in the FIG. 4b. As an example, while dopant concentration in the source 414 can be $10^{19}$-$10^{22}$ atoms/cm$^3$, the N-well 444 can having a dopant concentration of $10^{16}$-$5*10^{18}$. Base fin portion 460 has a similar doping to that of N-well 444. The fin 420, base fin portion 460, and the lightly doped N-well 444 serve as the conductive path (i.e. channel) between the source 414 and the drain 416 when the gate 404 is activated with a gate bias voltage. By lightly doping the N-well 444 and disposing the gate closer to the source in comparison to the drain, the resistance between the source and the drain is increased, thus allowing for a higher breakdown voltage of the device. A device with an extended drain region as discussed above can also be known as a laterally diffused metal oxide semiconductor (LDMOS).

Similar to source 414, drain 416 can be disposed within a fin 422. Dummy gates 406 and 408 are disposed above and wrapped around the edges of fin 422 as illustrated. In the same manner as dummy gate 402 and gate 404, dummy gates 406 and 408 act to constrain the epitaxial growth of raised drain region 416. Spacer layer 448 can also be disposed above dummy gates 406 and 408 to provide any required spacing.

In order provide protection between the electrically active gate 404 and fin 420 (i.e., to ensure that the metal of gate 404 does not contact the fin directly) an oxide layer 450 can be disposed between gate 404 and fin 420, e.g. between a bottom surface of gate 404 and a top surface of fin 420 as illustrated. For process efficiency, oxide layer 450 can also be disposed between dummy gate 402 and fin 420, e.g. between a bottom surface of gate 404 and a top surface of fin 420. As an example, the thickness of oxide layer 450 can be approximately 3 nm thick. Similarly, oxide layer 452 can be disposed between dummy gates 406 and 408 to provide protection between the metal layers of the dummy gates and fin 422. Conventionally, the same type of oxide used to protect fin 420 from dummy gate 402 and gate 404 can be used to protect fin 422 from dummy gate 406 and 408. Therefore, in one embodiment, the thickness of gate oxide layer 452 can also be approximately 3 nm, or can be reduced as will be discussed below.

Using dummy gates to constrain epitaxial growth of doped regions within a fin can also create constraints with respect to the footprint of a particular finFET device. For example, each dummy gate and/or electrically connected gate must maintain a certain distance away from any adjacent gates to ensure minimal electrical interference and/or minimal defectivity. The thickness of the oxide used to protect the fin structures from the gate metal also contributes to the overall footprint of the device by forcing the gates to be spaced a certain distance apart. Therefore, any efforts to reduce the footprint of the dummy gate structures used to constrain epitaxial growth can lead to an overall and significant decrease in the footprint of the finFET device.

As an example of the effect that dummy gate structures can have upon the overall footprint of a device, the thickness of the gate oxide layer 450 can have an impact on gate lengths of gate 404 and dummy gate 402 (shown in FIG. 4a as dimension 454). The thickness of the gate oxide layer 452 can have an impact on the gate lengths of dummy gate structures 406 and 408 (shown in FIG. 4a as dimension 456). The gate lengths can have an impact on the thickness of the source region 414, the drain region 416 (shown in FIG. 4a as dimension 458). When both the gate oxide layers 450 and 452 are 3 nm as described above, dimensions 454, 456, and 458 can take on the following exemplary values:

| Dimension 454 | 360 nm |
| Dimension 456 | 86 nm |
| Dimension 458 | 59 nm |

The thickness of gate oxide layer 450 is primarily driven by the electrical requirements of gate structure 404. Depending on the amount of voltage applied to gate 404 during operation of the finFET device, the gate oxide layer 450 should be sufficiently thick enough to provide the necessary protection between the metal layer of the gate structure 404 and the fin 420. However, as both dummy gate structures 406 and 408 are electrically isolated (i.e., non-functioning gate structures that don't receive a control voltage), the requirements on the thickness of gate oxide layer 452 can be less than that of gate oxide layer 450.

Recognizing that the thickness requirement for gate oxide layer 452 is less than that of gate oxide layer 450, the thickness of gate oxide layer 452 can be manipulated to yield a reduced footprint of the overall finFET device. As an example, while the thickness of gate oxide layer 450 can be 3 nm in order to provide protection to fin 420 from the gate metal of gate structure 404, the thickness of gate oxide layer 452 can be reduced to 1 nm since dummy gates 406 and 408 are electrically isolated. By reducing the thickness of oxide layer 452, the pitch of dummy gates 406 and 408 (i.e., the distance that the dummy gates are spaced apart from each other) can be reduced, e.g. relative to the pitch gate structure 404 and dummy gate 402. As the distance between the dummy gates acts as a constraint against the epitaxial growth of drain 416, by reducing the gate pitch, the thickness of the drain region 416 is also reduced. With the thickness of gate oxide layer 450 at 3 nm and the thickness of gate oxide layer 452 at 1 nm, dimensions 454, 456, and 458 can take on the following exemplary values.

| Dimension 454 | 360 nm |
| Dimension 456 | 20 nm |
| Dimension 458 | 35 nm |

The chart below compares dimensions 454, 456, and 458 for the example when both gate oxide layers 450 and 452 have a gate oxide thickness of 3 nm, with the example when the gate oxide layer 450 is 3 nm and the gate oxide layer 452 is 1 nm.

|  | Gate Oxide<br>Layer 450 = 3 nm<br>Gate Oxide<br>Layer 452 = 3 nm | Gate Oxide<br>Layer 450 = 3 nm<br>Gate Oxide<br>Layer 452 = 1 nm |
| --- | --- | --- |
| Dimension 454 | 360 nm | 360 nm |
| Dimension 456 | 86 nm | 20 nm |
| Dimension 458 | 59 nm | 35 nm |

As illustrated by the above chart, when gate oxide layer 452 is reduced (i.e., thinner than gate oxide layer 450), dimensions 456 and 458 also are reduced. This reduction in thickness in gate oxide layer 452 thus yields a reduced footprint of the overall finFET device. In the example above, a reduction in the thickness of gate oxide layer 452 with respect to the thickness of gate oxide layer 450 can reduce the footprint of dummy gates 406 and 408, as well as reduce the footprint of drain region 416. This reduction in the footprints of the components of a finFET device can lead to an overall reduction in the footprint of the overall finFET device.

While reducing the footprint of the device is often a goal, that goal should be tempered by the need to maintain performance of the device with the reduced footprint. As an example, while reducing the thickness of the gate oxide layer 452 relative to that of gate oxide layer 450 can reduce the footprint of the finFET components as discussed above, the overall performance of the device can be degraded due to the reduced footprint. Specifically, by reducing the footprint of the drain region 416 (i.e., dimension 458) the vertical resistance of the drain will increase (because the drain in thinner). This change in the vertical resistance can lead to performance degradation in the finFET device. In order to maintain performance, the doping of the substrate beneath the drain can be adjusted to compensate for the change in the vertical resistance experienced when the footprint of the drain region 416 is reduced.

Referring back to FIG. 4b, an n-well 444 is disposed beneath gate 404, shallow trench isolation layer 426, dummy gates 406 and 408, and fin 422 which includes drain region 416 as illustrated in the figure. N-well 444 forms the extended current path described above for carriers generated by the source region 414. Also as described above, by reducing the thickness of gate oxide layer 452 relative to gate oxide layer 450, the thickness of drain region 416 is reduced thus increasing the vertical resistance of the drain, which can lead to performance degradation of the device. One way in which to compensate for the change in vertical resistance of drain 416 is to alter the dopant concentration of the n-well.

Figure 5A:
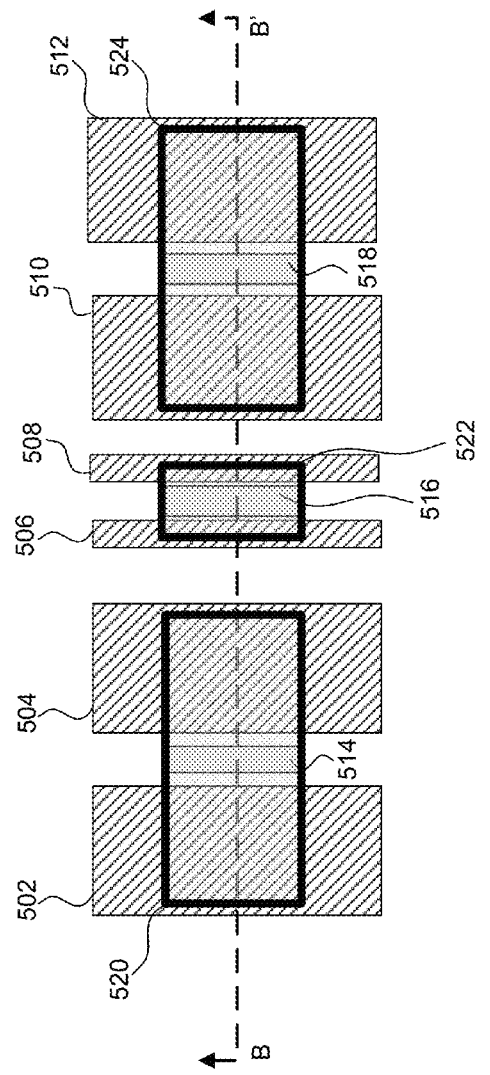
FIG. 5a is a top view of a second exemplary embodiment of a finFET having an extended current path between source and drain terminals according to examples of the disclosure.
Figure 5B:
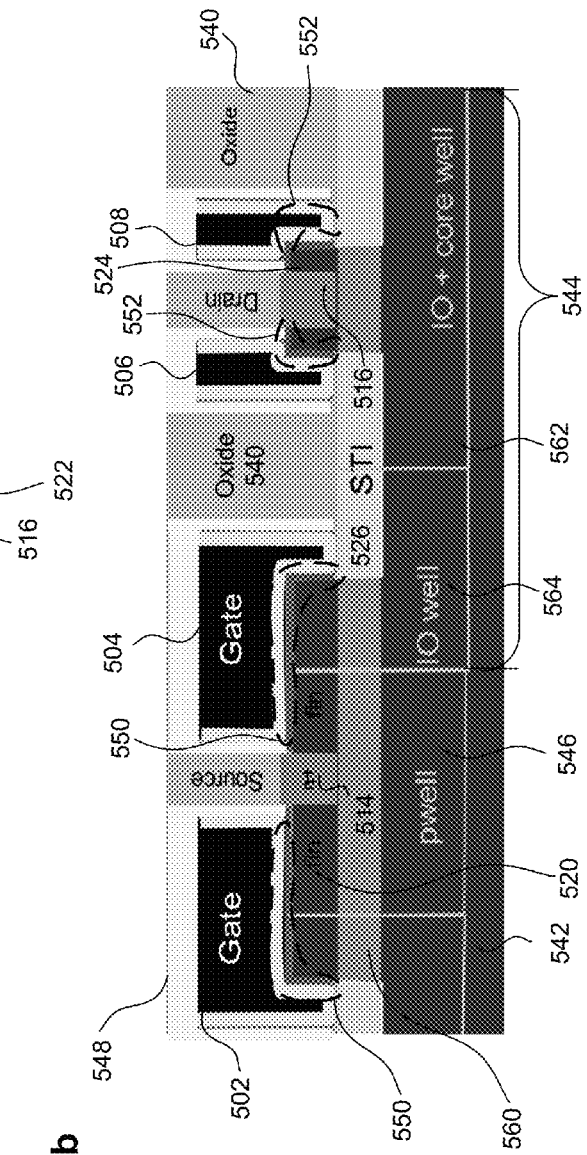
FIG. 5b is a cross-sectional view of the structure of FIG. 5a according to examples of the disclosure.

FIGS. 5a and 5b illustrate an extended current path finFET device in which the dopant concentration of the extended current path is adjusted to compensate for the reduced footprint of the drain according to examples of the disclosure. In the figure, dummy gate 502, gate 504, dummy gate 506, dummy gate 508, dummy gate 510, dummy gate 512, source region 514, drain region 516, source region 518, shallow trench isolation region 526, base fin region 560, fins 520, 522, and 524 are identical to the functionality and arrangement of their counterparts in FIG. 4a, and thus a detailed discussion of those components can be found in the discussion of FIG. 4a above.

FIG. 5b is a cross-sectional view of the structure of FIG. 5a taken through line B-B'. The device depicted in FIG. 5b is similar to the device depicted in FIG. 4b, with the exception of n-well 544 which will be discussed in detail below. Thus, for expediency, the figure has been labeled such that a particular number 5xx, corresponds to the number 4xx of FIG. 4b. As an example, dummy gate 502 corresponds to dummy gate 402 of FIG. 4b. Fin 524 and its associated components 510, 512, and 518 are not shown in FIG. 5b.

In the device depicted in FIG. 5b, the n-well 544 is altered to account for the increase in vertical resistance seen at drain 516 due to the reduction in thickness of gate oxide layer 552 in relation to gate oxide layer 550. N-well 544 can have two separate dopant concentration regions 564 and 562, both having a doping range of $10^{16}$-$5*10^{18}$. Region 562 can have a higher dopant concentration than region 564 to compensate for the increased vertical resistance created by reducing the footprint of the drain 516. In one example, region 564 can have a dopant concentration equal to that of the n-well 444 illustrated in FIG. 4b. In order to compensate for the increase in vertical resistance seen at drain region 516 as discussed above, an additional dopant layer can be added to region 564 to form region 562, which is disposed directly underneath the drain region 516.

An n-well such as that depicted at 544 in FIG. 5b can be created by implanting silicon with impurities to create a doped region. The level of doping (i.e., the concentration of impurities) can depend on how the particular semiconductor device is to be utilized within an electronic device. For instance, if the semiconductor device is to employed near the input/output port of a device, then the dopant concentration can be decreased to enable the device to have a higher breakdown voltage and thus able to handle higher voltage inputs that may occur due to the semiconductor's proximity to the input/output of the electronic device. This lower doped n-well is known in the art as an IO well. In contrast, if the semiconductor is to be employed in the core of the device (i.e., away from the input/output) than a higher dopant concentration (relative to an IO well process) can be employed to create an n-well. This higher doped n-well is known in the art as a core well.

To create the various n-well regions in the device of FIG. 5b, the n-well 544, in a first process can be created by depositing an IO well process throughout the n-well region. Because the purpose of an extended current path device is to enable the device to handle higher input voltages, filling n-well 544 with an IO well is consistent with the goal of the device.

In order to compensate for the reduced footprint of the gate, the n-well can be further doped beneath the drain 516 in an area of the n-well depicted by region 562. By further doping region 562 of n-well 544, the n-well now includes two separate regions. A first region 564, in which only the IO well dopant is applied, and a second region 562 in which both the core well dopant and the IO well dopant are applied. Because region 562 has two dopant processes applied to it, it will have a higher dopant concentration than region 564 of n-well 544.

In addition to altering the dopant concentrations of the n-well, the change in vertical resistance caused by the reduction of the footprint of the drain as described can also be mitigated by including multiple drain regions within a given fin.

Figure 6A:
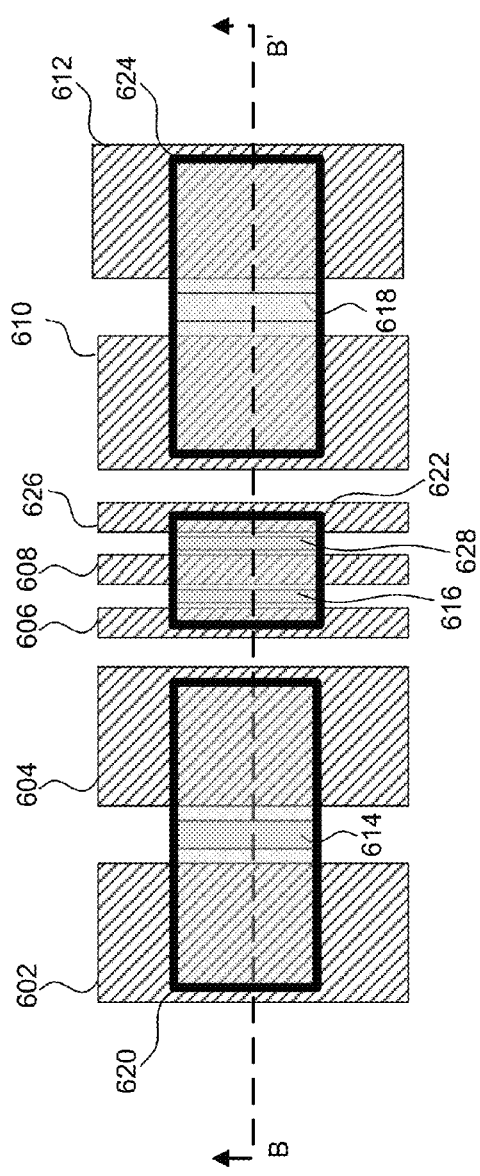
FIG. 6a is a top view of a third exemplary embodiment of a finFET having an extended current path between source and drain terminals according to examples of the disclosure.

FIG. 6a illustrates an exemplary extended current path finFET device with multiple drain regions embedded in a single fin according to examples of the disclosure. The device illustrated in FIG. 6a is similar to the device illustrated in FIG. 4a. Dummy gates 602 and 610, source regions 614 and 618, gate regions 604 and 612, base fin region 660, and fins 620 and 622 are arranged in the same manner as described with respect to their counterparts in FIG. 4a.

Therefore, a detailed explanation with respect to their arrangement and functionality can be found in the corresponding discussion of their counterparts with respect to FIG. 4a above.

The primary difference between the device depicted in FIG. 4a and the device depicted in FIG. 6a is that the fin 622 contains two drain regions 616 and 628, and three dummy gates 606, 608, and 626 that are wrapped around fin 622 to constrain the epitaxial growth of the two drain regions.

Figure 6B:
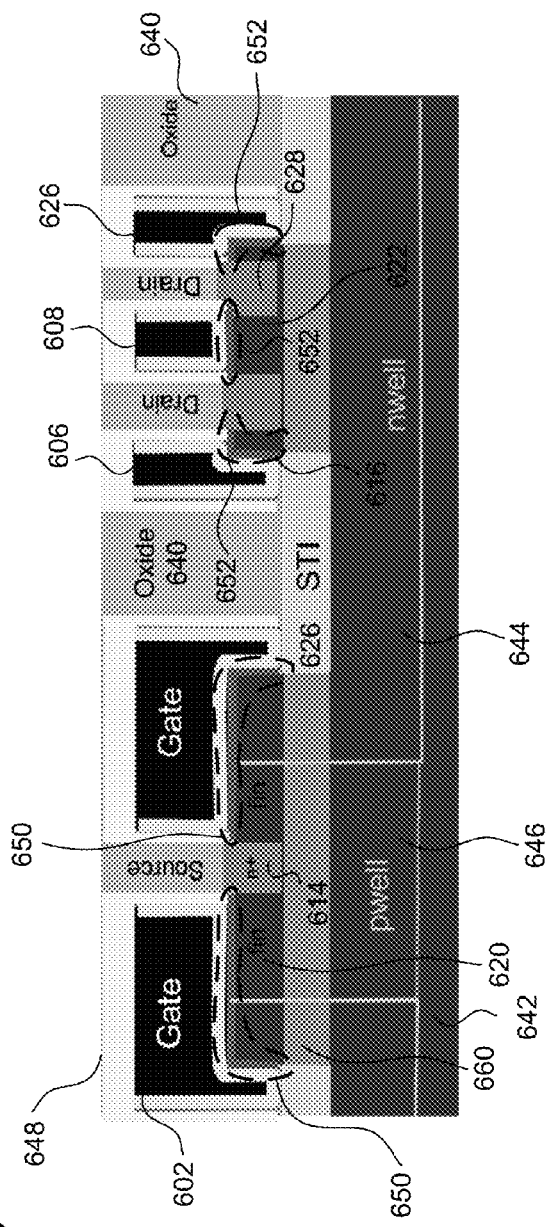
FIG. 6b is a cross-sectional view of the structure of FIG. 6a according to examples of the disclosure.

FIG. 6b is a cross-sectional view of the structure of FIG. 6a taken through line B-B'. As discussed with respect to FIG. 4b, the gate oxide layer 652 is not required to be as thick as gate oxide layer 650. Therefore, as an example, gate oxide layer 650 can be approximately 3 nm, while gate oxide layer 652 can be approximately 1 nm. By adding two drain regions 616 and 628 to fin 622, the change in vertical resistance caused by the drain being thinner (due to the thinner gate oxide layer) can be mitigated. As discussed above, reducing the thickness of the gate oxide layer 652, decreases the pitch of dummy gates 606, 608, and 626. By decreasing the pitch of the dummy gates 606, 608, and 626, any epitaxial growth that occurs between the gates will ultimately result in a thinner and vertically taller source/drain region, which can lead to a change in the vertical resistance of the channel. By adding two drains (i.e., epitaxial regions), the change in vertical resistance is counteracted by the increase in surface area that results from adding an additional drain region. Fin 624 and its associated components 610, 612, and 618 are not shown in FIG. 5b.

While reducing the thickness of gate oxide layer 652 will reduce the footprint of the overall device, the addition of an extra drain region 628 and an additional dummy gate 626 may counteract the reductions in the device engendered by the reduced gate oxide layer thickness. However, in the example above, the reduction in footprint caused by the thinning of gate oxide layer 652 can be greater than the increase in footprint caused by adding dummy gate 626 and the additional drain region 628, thus leading to a net decrease in footprint of the device.

CONCLUSION

It is to be appreciated that the Detailed Description section, and not the Abstract of the Disclosure, is intended to be used to interpret the Claims. The Abstract of the Disclosure is not intended to limit the subjoined Claims in any way.

The foregoing disclosure outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
a first fin disposed on a first region of a substrate;
a gate structure and a first dummy gate disposed on the first fin;
a first gate oxide layer disposed between the gate structure and the first fin, and also disposed between the first dummy gate and the first fin;
a source region disposed at least partially within the first fin, wherein the source region is disposed between the gate structure and the first dummy gate;
a second fin disposed on a second region of the substrate and spaced laterally apart from the first fin;
second and third dummy gates disposed on the second fin;
a second gate oxide layer disposed between the second dummy gate and the second fin, and also disposed between the third dummy gate and the second fin; and
a drain region disposed at least partially within the second fin, wherein the drain region is disposed between the second and third dummy gates;
wherein a thickness of the second gate oxide layer is less than a thickness of the first gate oxide layer;
wherein the first region of the substrate is doped with dopant atoms of a first conductivity tune, and wherein the second region of the substrate is doped with dopant atoms of a second conductivity type;
wherein the second region of the substrate is further divided into a first sub-region and a second sub-region that are laterally adjacent to one another, wherein the second sub-region of the second region of the substrate is disposed beneath the drain region and not beneath the are structure; and
wherein a first dopant concentration of the first sub-region is less than a second dopant concentration of the second sub-region.

2. The transistor of claim 1, wherein the gate structure and the first dummy gate are arranged and configured to constrain an epitaxial growth of the source region.

3. The transistor of claim 1, wherein the second dummy gate and the third dummy gate are arranged and configured to constrain an epitaxial growth of the drain region.

4. The transistor of claim 1, wherein a pitch of the first dummy gate and the gate structure is greater than a pitch of the second and third dummy gates.

5. The transistor of claim 1, wherein the gate structure includes a plurality of edges, the source region includes a plurality of edges, and the drain region includes a plurality of edges, and wherein a distance between proximal edges of the gate structure and the source region is less than a distance between proximal edges of the gate structure and the drain region.

6. The transistor of claim 5, wherein a shallow trench isolation layer is disposed between proximal edges of the gate structure and the drain region.

7. The transistor of claim 1, wherein the source region and the drain region are doped using in-situ doping techniques.

8. The transistor of claim 1, wherein the first region of the substrate includes a p-well and the second region of the substrate includes a n-well.

9. The transistor of claim 8, further comprising a shallow trench isolation layer disposed on a top surface of the n-well and between proximal edges of the gate structure and the drain region.

10. The transistor or claim 9, wherein a lateral distance between the gate structure and the drain region is longer than a lateral distance between the gate structure and the source region.

11. The transistor or claim 8, wherein the n-well includes: the first sub-region having the first dopant concentration, and the second sub-region having the second dopant concentration.

12. The transistor of claim 11, wherein the second dopant concentration is greater than the first dopant concentration.

13. A transistor, comprising:
a first fin disposed on a first region of a substrate;
a gate structure and a first dummy gate disposed on the first fin;
a first gate oxide layer disposed between the gate structure and the first fin, and also disposed between the first dummy gate and the first fin;
a source region disposed at least partially within the first fin, wherein the source region is disposed between the gate structure and the first dummy gate;
a second fin disposed on a second region of the substrate and spaced laterally apart from the first fin;
second and third dummy gates disposed on the second fin; and
a second gate oxide layer disposed between the second dummy gate and the second fin, and also disposed between the third dummy gate and the second fin;
wherein a thickness of the second gate oxide layer is less than a thickness of the first gate oxide layer;
wherein the first region of the substrate includes a p-well and the second region of the substrate includes a n-well;
wherein the n-well is further divided into a first sub-region and second sub-region that are laterally adjacent to one another, wherein the second sub-region of the n-well is disposed beneath a drain region of the transistor and not beneath the gate structure; and
wherein the first sub-region of the n-well has a first doping concentration and the second sub-region of the n-well has a second doping concentration, wherein the second doping concentration is greater than the first doping concentration.

14. The transistor of claim 13, further comprising a shallow trench isolation layer disposed on a top surface of the n-well and between proximal edges of the gate structure and the drain region.

15. The transistor of claim 13, wherein the gate structure and the first dummy gate are arranged and configured to constrain an epitaxial growth of the source region.

16. The transistor of claim 13, wherein the second dummy gate and the third dummy gate are arranged and configured to constrain an epitaxial growth of the drain region.

17. The transistor of claim 13, wherein a pitch of the first dummy gate and the gate structure is greater than a pitch of the second and third dummy gates.

18. The transistor of claim 13, wherein the first sub-region of the n-well is disposed beneath a portion of the gate structure of the transistor and not beneath the drain region of the transistor.

19. The transistor of claim 18, wherein the p-well is disposed under the portion of the gate structure of the transistor and laterally adjacent to the first sub-region of the n-well.

20. The transistor of claim 1, wherein:
the first sub-region of the second region of the substrate is disposed beneath a first portion of the gate structure of the transistor and not beneath the drain region of the transistor; and
the first region of the substrate is disposed beneath a second portion of the gate structure of the transistor and laterally adjacent to the first sub-region of the second region of the substrate.

* * * * *

UNITED STATES PATENT AND TRADEMARK OFFICE
CERTIFICATE OF CORRECTION

PATENT NO.          : 9,698,148 B2
APPLICATION NO.     : 14/954700
DATED               : July 4, 2017
INVENTOR(S)         : Ponoth et al.

It is certified that error appears in the above-identified patent and that said Letters Patent is hereby corrected as shown below:

In the Claims

In Column 12, Line 20, replace "first conductivity tune" with --first conductivity type--.

Signed and Sealed this
Tenth Day of April, 2018

Andrei Iancu
*Director of the United States Patent and Trademark Office*